(12) United States Patent
Ohno et al.

(10) Patent No.: US 11,888,438 B2
(45) Date of Patent: Jan. 30, 2024

(54) OPTICAL ELEMENT, LIGHTING APPARATUS AND SOLAR CELL DEVICE

(71) Applicant: KABUSHIKI KAISHA TOSHIBA, Tokyo (JP)

(72) Inventors: Hiroshi Ohno, Tokyo (JP); Takashi Usui, Saitama Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 16/804,027

(22) Filed: Feb. 28, 2020

(65) Prior Publication Data
US 2021/0083620 A1   Mar. 18, 2021

(30) Foreign Application Priority Data
Sep. 18, 2019   (JP) .................................. 2019-168953

(51) Int. Cl.
*H02S 40/22*   (2014.01)
*F21V 5/04*    (2006.01)
*G02B 3/06*    (2006.01)

(52) U.S. Cl.
CPC .............. *H02S 40/22* (2014.12); *F21V 5/043* (2013.01); *G02B 3/06* (2013.01)

(58) Field of Classification Search
CPC .... G02B 19/008; G02B 19/0014; G02B 3/00; G02B 3/06; F21V 5/045; H02S 40/22
See application file for complete search history.

(56) References Cited

U.S. PATENT DOCUMENTS

| | | | |
|---|---|---|---|
| 5,818,644 A | 10/1998 | Noda | |
| 2011/0100428 A1 | 5/2011 | Sasaoka et al. | |
| 2012/0028007 A1* | 2/2012 | Kildishev | G01J 5/08 428/212 |
| 2014/0076398 A1* | 3/2014 | Gordon | G02B 3/0087 703/2 |
| 2015/0192258 A1* | 7/2015 | Ohno | H01L 33/54 362/555 |
| 2016/0305620 A1 | 10/2016 | Pirrucchio et al. | |

FOREIGN PATENT DOCUMENTS

| | | |
|---|---|---|
| JP | H10-221558 A | 8/1998 |
| JP | 3396118 B2 | 4/2003 |
| JP | 2007-214292 A | 8/2007 |
| JP | 2014-63614 A | 4/2014 |

(Continued)

OTHER PUBLICATIONS

Machine translation of KR 20130024690 A, Jung Jae Heun et al. (Year: 2013).*

(Continued)

*Primary Examiner* — Mayla Gonzalez Ramos
(74) *Attorney, Agent, or Firm* — Finnegn, Henderson, Farabow, Garrett & Dunner, LLP

(57) ABSTRACT

According to one embodiment, an optical element includes a continuous gradient index distribution area, and a first medium. The continuous gradient index distribution area is configured to continuously attenuate gradient index from a center of the optical element in a radial direction. The first medium is at the center. The first medium includes an area where absolute value of imaginary part of a complex refractive index is greater than zero.

4 Claims, 3 Drawing Sheets

(56) References Cited

FOREIGN PATENT DOCUMENTS

| | | | |
|---|---|---|---|
| JP | 2016-522984 A | | 8/2016 |
| KR | 10-2013 0024690 A | | 3/2013 |
| KR | 20130024690 A | * | 3/2013 |
| WO | WO 2009/139414 A1 | | 11/2009 |
| WO | WO 2011/109096 A1 | | 9/2011 |
| WO | WO 2012/033840 A2 | | 3/2012 |

OTHER PUBLICATIONS

Chen et al., "Modified Luneburg Lens Based on Metamaterials," International Journal of Antennas and Propagation, vol. 2015, Article 902634, 6 pages (Jan. 29, 2015).
Gordon, "Spherical gradient-index lenses as perfect imaging and maximum power transfer devices," Applied Optics, 39:3825-32 (Aug. 1, 2000).

* cited by examiner

OPTICAL ELEMENT, LIGHTING APPARATUS AND SOLAR CELL DEVICE

CROSS REFERENCE TO RELATED APPLICATION

This application is based upon and claims the benefit of priority from prior Japanese Patent Application No. 2019-168953, filed Sep. 18, 2019, the entire contents of which are incorporated herein by reference.

FIELD

Embodiments described herein relate generally to an optical element, a lighting apparatus and a solar cell device.

BACKGROUND

In a conventional optical element such as a wide-angle lens, light rays can be collected from a wide viewing angle.

DETAILED DESCRIPTION

Hereinafter, embodiments will be described with reference to the accompanying drawings. The drawings are schematically or conceptually illustrated.

The object to be achieved by the embodiments includes providing an omnidirectionally light-collecting optical element, a lighting apparatus including the optical element, and a solar cell device including the optical element.

According to one embodiment, the optical element includes a continuous gradient index distribution area which is configured to continuously attenuate a refractive index from a center of the optical element in a radial direction. The optical element includes a first medium at the center. The first medium includes an area where absolute value of imaginary part of a complex refractive index is greater than zero.

First Embodiment

FIGS. 1 to 4 will be referred to for explaining an optical element 10 according to a first embodiment.

Figure 1:
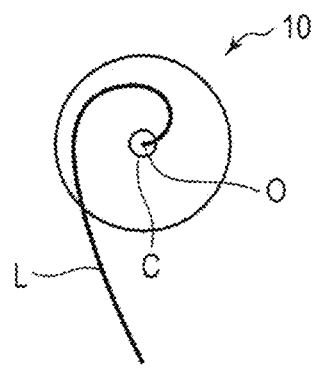
FIG. 1 is a schematic view of a spherical optical element according to a first embodiment.

The optical element 10 according to the embodiment is formed from a medium (first medium) transparent to optical waves. As shown in FIG. 1, the optical element 10 according to the present embodiment is for example, of a spherical shape. The optical element 10 is not limited to such a shape and may adopt any shape as long as it is axisymmetrical. Thus, the optical element 10 may be of a cylindrical shape. The optical element 10 may be a substantially-axisymmetric polygonal prism. The optical element 10 according to the present embodiment uses for example, a meta-lens.

Optical waves here includes visible light, x-rays, millimeter waves, or electromagnetic waves and are waves that include an electric field component and a magnetic field component. Transparent refers to a property of transmitting even a small amount of light and may involve absorption of optical waves. In one example, the optical wave is visible light and the medium is silicon. The complex refractive index n of the medium is given as:

$$n = N + iK \quad (1)$$

N is a real part and generally called a refractive index. K is an imaginary part and generally called an extinction coefficient.

Figure 2:
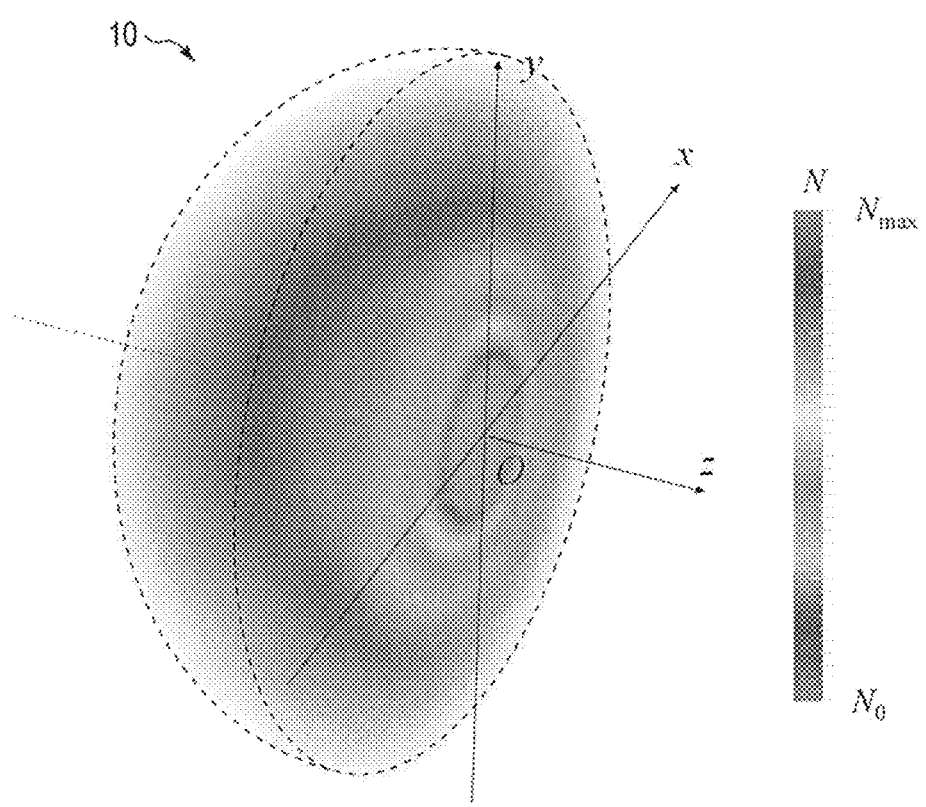
FIG. 2 is a schematic view including a perspective view of the optical element shown in FIG. 1 cut in half at a plane including the center of the optical element, and an indication of a continuous gradient index distribution area which continuously and radially attenuates a refractive index from the center.

FIG. 2 is a perspective view of the spherical optical element 10 according to the present embodiment, cut at a plane through the center O. The center O of the optical element 10 of the present embodiment is set as the origin and Cartesian coordinates (x, y, z) are placed. In FIG. 2, as one example, the optical element 10 is cut in half at the plane of z=0. The refractive index N is shown by a color contour (gray scale contour) on the z=0 plane (xy-plane). The refractive index N of the optical element 10 according to the present embodiment continuously changes from the center O towards an outer side. The refractive index N does not drastically decrease, but rather gradually decreases from the center O towards the outer side in the radial direction. Thus, the optical element 10 includes a continuous gradient index distribution area which continuously attenuates the refractive index from the center O in a radial direction. In other words, the refractive index N of the optical element 10 becomes higher towards the center O.

Figure 3:
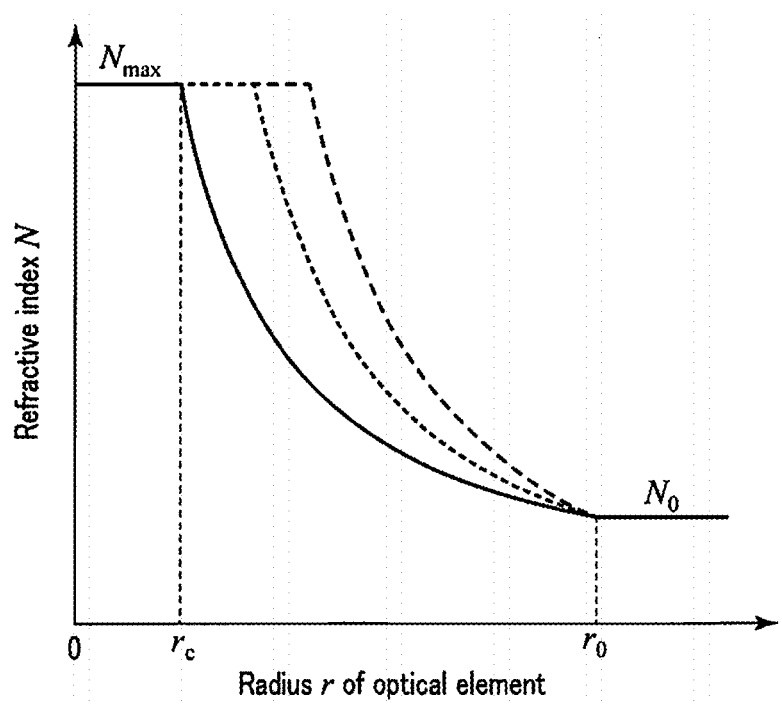
FIG. 3 is a schematic graph showing a refractive index distribution between a refractive index of an area from the center to an outer edge of the core of the optical element shown in FIG. 1, and a refractive index of a peripheral environment of the optical element.

In FIG. 3, with the origin O as the center of the optical element 10 according to the present embodiment, the refractive index N is plotted with respect to the radius r. The area within the radius $r_c$ from the center O of the optical element 10 is called "core C." The distribution of the refractive index N shown in FIG. 3, for the area having the radius r of from $r_c$ to $r_o$, is represented as:

$$N = N_0 \left(\frac{r_0}{r}\right)^m \quad (2)$$

where $N_o$ is a refractive index of an environment. In the present embodiment, when the environment is presumed to be air, the refractive index $N_o$ of the environment is 1. The refractive index $N_o$ of the environment is a constant which may take a different value depending on the environment.

According to the present embodiment, another example of the environment aside from air can be water. In such a case, the refractive index $N_o$ of the environment is, for example, 1.33.

m is a constant of 1 or more. In FIG. 3, a solid line shows when m is 1.0 and dashed lines show when m is 1.5 and when m is 2.0, respectively. The case where m is 1.5 is shown between the case where m is 1.0 and the case where m is 2.0. Thus, the refractive index N of the continuous gradient index distribution area of the optical element 10 fulfills $$N \geq N_0 \left(\frac{r_0}{r}\right) \quad (3)$$

for the area having the radius r of the optical element 10 of from $r_c$ to $r_o$. Further, the maximum value $N_{max}$ of the refractive index of a contact area where the medium of the core C (first medium) contacts the continuous gradient index distribution area outside the core C is represented by:

$$N_{max} = N_0 \left(\frac{r_0}{r_c}\right)^m \quad (4)$$

The inner side of the core C containing the center O is provided with the first medium (for example, silicon). The inner side of the core C containing the center O has a refractive index that matches the maximum value $N_{max}$ of the refractive index N of the optical element 10. In the optical element 10, the radius of the contact area is $r_c$ and the maximum value of the radius r is $r_o$.

The core C (first medium) includes an area where the absolute value of the imaginary part K of the complex refractive index n is greater than zero.

As can be seen from the above, the optical element 10 according to the present embodiment includes an area which continuously attenuates the refractive index N as the radius r becomes larger, so that the refractive index N meets the equation (3) for the radius r from the center O. The optical element 10 matches the refractive index $N_o$ of the environment at the radius $r_o$. The radius $r_o$ corresponds to, for example, the outer circumference of the optical element 10.

The operation of the optical element 10 according to the present embodiment will be explained.

Optical waves (which will be denoted by L) bend toward an area showing a higher refractive index N. According to the calculation based on a ray equation derived from Lagrangian optics, the optical wave L incident on the optical element 10 having the distribution of the refractive index N that meets the equation (3) is always directed towards the center O of the optical element 10, regardless of its incident direction.

Figure 4:
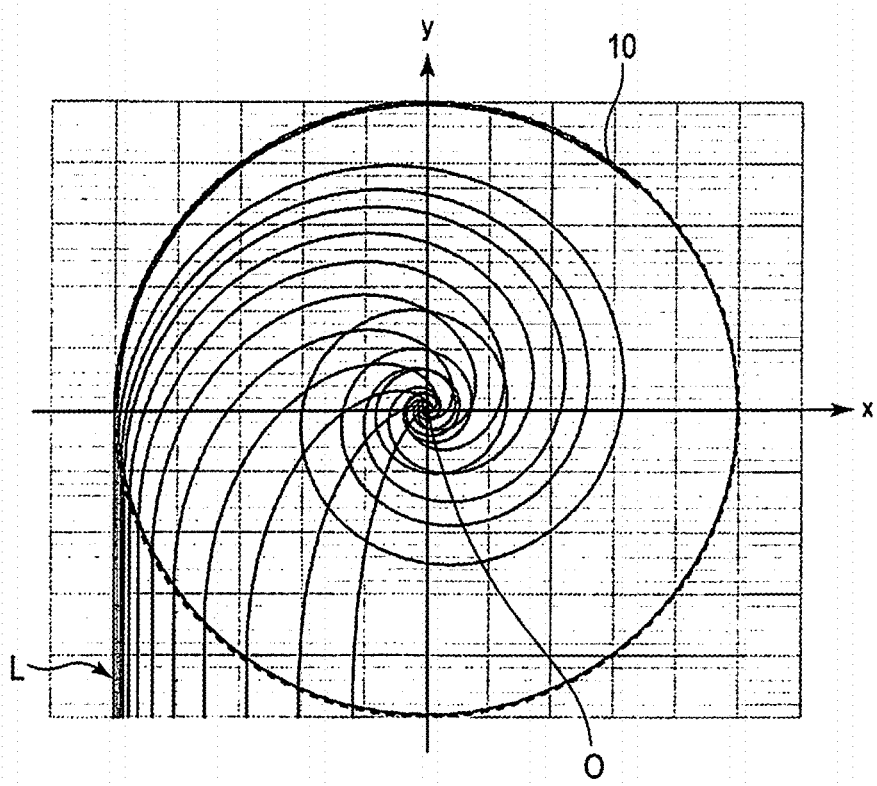
FIG. 4 is a schematic view showing a path of a optical wave in an xy-plane when the optical wave enters the optical element shown in FIG. 1 from a given direction.

For simplification of the explanation, as one example, an xy-plane where z=0 as shown in FIG. 4 will be considered. Each optical wave L here travels from the negative side to the positive side along the y-axis, and the optical wave L that intersects the x-axis in the negative domain is directed towards the center O with a higher refractive index N. This behavior is not limited to such a two-dimensional case as the xy-plane, but is also true in three-dimensional cases such as the xyz Cartesian coordinate system. Therefore, no matter what direction the optical wave L is incident upon the optical element 10, the optical wave L is directed towards the center O. Thus, when the optical wave L is incident upon the optical element 10, the optical wave L reaches the core C of the radius $r_c$ containing the center O.

From the equation (4), the refractive index N is continuous at the boundary (contact area) of the core C. Thus, the optical element 10 has no gap in the refractive index N at the boundary (contact area) of the core C. Therefore, there is no drastic change in the refractive index at the boundary (contact area) of the core C, which serves as a prevention against loss of light due to the Fresnel reflection in the optical element 10.

The core C of the optical element 10 includes an area having an absolute value of the imaginary part K of the complex refractive index n that is greater than zero. Thus, the optical wave L is absorbed at this area in the core C of the optical element 10, where the absolute value of the imaginary part K of the complex refractive index n of the core C is greater than zero. On the other hand, if the absolute value of the imaginary part K is zero, the optical wave L entering the core C would exit the core C. In other words, the optical element 10 is adapted to collect the omnidirectional optical waves L to the core C and absorb the omnidirectional optical waves L. More specifically, by for example disposing an area sensor which converts the energy of the absorbed optical waves L into electricity, the omnidirectional information can be acquired as an image. On the other hand, an ordinary lens is not able to collect the omnidirectional optical waves L in the core C.

According to the present embodiment, an optical element 10 capable of collecting light omnidirectionally can be provided.

Modification Example

The optical element 10 according to the first embodiment is of a spherical shape. The optical element 10 is not limited to a spherical shape. The shape of the optical element 10 of the present modification example is for example, a cylindrical shape. The shape of the optical element 10 may be another shape as long as the shape includes a cross section having a distribution of the refractive index N that meets the equation (3). By conforming the z-axis to the central axis of the cylinder, any cross section intersecting the central axis of the cylinder is an xy-plane. In this case, similar to those shown in FIG. 4, the incident optical wave L parallel to the xy-plane is directed to the center O along the xy-plane.

According to the modification example, an optical element 10 capable of collecting light omnidirectionally can be provided.

Second Embodiment

Figure 5:
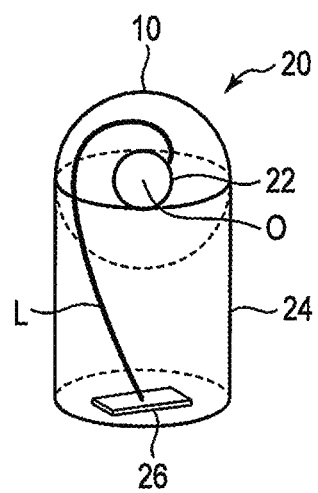
FIG. 5 is a schematic perspective view showing a lighting apparatus including the optical element shown in FIG. 1, according to a second embodiment.

Next, FIG. 5 will be referred to for explaining a lighting apparatus 20 according to a second embodiment. The lighting apparatus 20 according to the second embodiment uses the optical element 10 explained in the first embodiment.

As shown in FIG. 5, the lighting apparatus 20 according to the present embodiment includes the spherical optical element 10, a fluorescent body 22, a transparent rod 24, and a light source 26.

The rod 24 is for example, of a substantially cylindrical shape. The rod 24 supports the spherical optical element 10. The rod 24 and the spherical optical element 10 may be integrated. It is preferable if a refractive index of the rod 24 and the refractive index N of the optical element 10 at the radius $r_o$ (i.e., a refractive index of a boundary between the rod 24 and the optical element 10) match or substantially match each other.

In the rod 24, the light source 26 is disposed on, for example, the opposite side from the optical element 10. The light source 26 uses, for example, an LED (light-emitting diode). The light source 26 may for example be an LD (laser diode) or a laser. The light source 26 may be a tungsten filament as used in halogen lamps, etc. Various configurations or components may be used as the light source 26. A wavelength of the optical wave L emitted from the light source 26 may be, for example, 450 nm, and this will be called a first wavelength. The rod 24 transmits the optical wave L of the first wavelength emitted from the light source 26.

In the spherical optical element 10, a portion of the core C containing the center O explained in the first embodiment is constituted by the fluorescent body 22. The fluorescent body 22 is of a spherical shape. The fluorescent body 22 absorbs the first wavelength light and converts it to light of a second wavelength on the longer wavelength side. For example, the second wavelength is 550 nm.

The operation of the lighting apparatus 20 according to the present embodiment will be explained.

The optical wave L of the first wavelength emitted from the light source 26 is incident on the transparent rod 24, and repeats total reflection in the rod 24 to reach the spherical optical element 10. A part of the optical wave L directly reaches the spherical optical element 10 without the total reflection in the rod 24.

The optical wave L having reached the spherical optical element 10 is directed towards the core C of the optical element 10 as explained in the first embodiment. Thus, the optical wave L is directed toward the fluorescent body 22. The optical wave L of the first wavelength is absorbed by the fluorescent body 22. The optical wave L of the first wavelength absorbed by the fluorescent body 22 is emitted from the fluorescent body 22 as a optical wave having the second wavelength. Such optical waves are eventually emitted from the spherical optical element 10.

The optical wave emitted from the fluorescent body 22 is an incoherent optical wave having a wide wavelength interval as compared to the optical wave of the first wavelength. The optical wave emitted from the fluorescent body 22 is dispersed in a wide light distribution. Such characteristics match the requirement of the lighting usage and are effective for the lighting usage.

With the above operation, the optical wave L having the first wavelength emitted from the light source 26 is converted to the optical wave having the second wavelength at the fluorescent body 22 in the core C of the optical element 10, and emitted from the same. In the course of this, the optical element 10 endows the light with characteristics required for the lighting usage, such as a wide wavelength interval, incoherency, and a wide light distribution. Thus, the lighting apparatus 20 can realize characteristics required for the lighting usage, such as a wide wavelength interval, incoherency, and a wide light distribution.

The lighting apparatus 20 according to the present embodiment can collect all of the light incident on the optical element 10 to the fluorescent body 22 in the core C. The optical wave L collected to the fluorescent body 22 in the core C is then emitted to the exterior with the wavelength changed. Thus, according to the present embodiment, a lighting apparatus 20 giving an extremely high efficiency such as 100% is provided.

Note that the rod 24 is not essential. The light from the light source 26 may be directly incident on the optical element 10.

Third Embodiment

Figure 6:
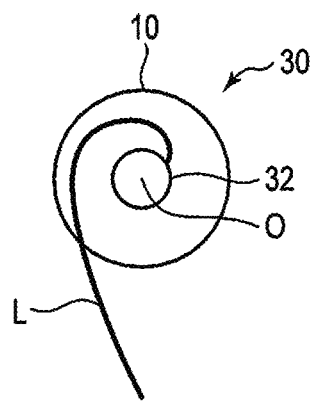
FIG. 6 is a schematic view showing a solar cell device including the optical element shown in FIG. 1, according to a third embodiment.

Next, FIG. 6 will be referred to for explaining a solar cell device 30 according to a third embodiment. The solar cell device 30 according to the third embodiment uses the optical element 10 explained in the first embodiment.

The solar cell device 30 according to the present embodiment includes the spherical optical element 10 and a solar cell 32 as shown in FIG. 6.

The spherical optical element 10 is the same as the first embodiment except that the solar cell 32 is disposed in the core C. More specifically, the solar cell 32 is included as the medium (first medium) of the core C containing the center O. In other words, the solar cell 32 is in the medium (first medium) of the core C containing the center O. The solar cell 32 may be an energy-converting element used in photovoltaic generation or a reactor used in solar thermal power generation. The solar cell 32 may be a heat storage material. The solar cell 32 may be placed at a light collector for collecting light from the sun or a heat collector for collecting thermal energy converted from light from the sun.

The optical element 10 according to the present embodiment can collect sunlight from every direction, as well as solar thermal energy based on sunlight, in the solar cell 32 (or the heat storage material) disposed in the core C. That is, the solar cell device 30 according to the present embodiment can collect sunlight from every direction in the solar cell 32 in the core C. Thus, by using the solar cell device 30 according to the present embodiment, the photovoltaic generation or solar thermal power generation can be efficiently performed without having to track the direction of the sun.

The solar cell device 30 according to the present embodiment can collect all of the light incident on the optical element 10 in the core C. Therefore, all of the sunlight incident on the optical element 10 can be collected in the core C. In addition, all of the thermal energy obtained from the sunlight can be collected in the core C. Thus, according to the present embodiment, a solar cell device 30 giving an extremely high efficiency is provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optical element comprising:
   a continuous gradient index distribution area which is configured to continuously attenuate gradient index from a center of the optical element in a radial direction; and
   a first medium at the center, the first medium including an area where absolute value of an imaginary part of a complex refractive index of the area is greater than the continuous gradient index distribution area outside the first medium, and the area absorbing light,
   when a refractive index of the continuous gradient index distribution area is N, a radius from the center is r>0, a maximum value of the radius r is $r_0$, a refractive index of an environment outside an outer peripheral surface of the optical element is $N_O$ which is a constant, and m is a constant of 1 or more, $$N = N_0 \left(\frac{r_0}{r}\right)^m$$

is fulfilled.

2. The optical element according to claim 1, wherein $$N \geq N_0\left(\frac{r_0}{r}\right)$$

is fulfilled.

3. The optical element according to claim 1, wherein when a refractive index of a contact area between the first medium and the continuous gradient index distribution area is $N_{max}$, a radius of the contact area is $r_c$, and $$N_{max} = N_0\left(\frac{r_0}{r_c}\right)^m$$

is fulfilled.

4. A lighting apparatus comprising:
the optical element according to claim 1; and
a light source,
wherein:
the first medium is a fluorescent body,
the light source is configured to emit light of a first wavelength, and
the fluorescent body is configured to absorb the light of the first wavelength, convert the light of the first wavelength to light of a second wavelength longer than the first wavelength, and emit the light of the second wavelength.

\* \* \* \* \*